(12) United States Patent
Pearce et al.

(10) Patent No.: US 7,919,352 B2
(45) Date of Patent: Apr. 5, 2011

(54) ELECTRICAL CONNECTION IN OLED DEVICES

(75) Inventors: Glenn T. Pearce, Webster, NY (US); Dustin L. Winters, Webster, NY (US); Lee W. Tutt, Webster, NY (US)

(73) Assignee: Global OLED Technology LLC, Herndon, VA (US)

( * ) Notice: Subject to any disclaimer, the term of this patent is extended or adjusted under 35 U.S.C. 154(b) by 693 days.

(21) Appl. No.: 11/733,409

(22) Filed: Apr. 10, 2007

(65) Prior Publication Data

US 2008/0252201 A1 Oct. 16, 2008

(51) Int. Cl.
*H01L 51/40* (2006.01)

(52) U.S. Cl. .......................................... 438/99; 438/940

(58) Field of Classification Search .................... 438/99, 438/940
See application file for complete search history.

(56) References Cited

U.S. PATENT DOCUMENTS

| | | | |
|---|---|---|---|
| 4,356,429 A | 10/1982 | Tang | |
| 5,276,380 A | 1/1994 | Tang | |
| 5,454,904 A * | 10/1995 | Ghezzo et al. | 216/13 |
| 5,550,066 A | 8/1996 | Tang et al. | |
| 5,916,460 A * | 6/1999 | Imoto et al. | 219/121.67 |
| 6,281,634 B1 | 8/2001 | Yokoyama | |
| 6,333,485 B1 * | 12/2001 | Haight et al. | 219/121.68 |
| 6,392,340 B2 | 5/2002 | Yoneda et al. | |
| 6,456,013 B1 | 9/2002 | Komiya et al. | |
| 6,501,466 B1 | 12/2002 | Yamagishi | |
| 6,535,185 B2 | 3/2003 | Kim et al. | |
| 6,538,374 B2 | 3/2003 | Hosokawa | |
| 6,737,800 B1 | 5/2004 | Winters et al. | |
| 6,753,654 B2 | 6/2004 | Koyama | |
| 6,872,591 B1 * | 3/2005 | Wang et al. | 438/106 |
| 6,894,747 B2 * | 5/2005 | Okumura | 349/113 |
| 6,995,035 B2 * | 2/2006 | Cok et al. | 438/82 |
| 7,135,405 B2 * | 11/2006 | Weng et al. | 438/662 |
| 2003/0147669 A1 | 8/2003 | Ishihara et al. | |
| 2004/0160170 A1 | 8/2004 | Sato et al. | |
| 2006/0199475 A1 | 9/2006 | Cok et al. | |
| 2006/0199476 A1 | 9/2006 | Cok et al. | |
| 2007/0048886 A1 * | 3/2007 | Winters et al. | 438/29 |

\* cited by examiner

*Primary Examiner* — Charles Garber
*Assistant Examiner* — Bryan R Junge
(74) *Attorney, Agent, or Firm* — Morgan, Lewis & Bockius LLP (57) ABSTRACT

In one aspect of the present invention, a method of making an OLED device comprises providing a substrate; a first electrode, a conductive bus line over the substrate and an organic electroluminescent media over the first electrode and over the conductive bus line. A laser that operating at a predetermined wavelength and is scanned over the conductive bus line in a predetermined direction so that the conductive bus line absorbs sufficient energy to cause the ablation a portion of the organic electroluminescent media over the conductive bus line thereby forming an opening in the organic electroluminescent media. The width of the laser beam in the predetermined direction is less than four times the width of the conductive bus line; and forming a second electrode over the organic electroluminescent media, the first electrode, and through the opening in the organic electroluminescent media.

15 Claims, 3 Drawing Sheets

ELECTRICAL CONNECTION IN OLED DEVICES

CROSS REFERENCE TO RELATED APPLICATIONS

The present application is related to U.S. Ser. No. 11/214,126, filed Aug. 29, 2005, of Dustin L. Winters et al., entitled "Electrical Connection In OLED Devices".

FIELD OF INVENTION

This invention relates to forming electrical connection between an electrode and a bus in an OLED device.

BACKGROUND OF THE INVENTION

In the simplest form, an organic electroluminescent (EL) device is comprised of organic electroluminescent media disposed between first and second electrodes. The first and second electrodes serve as an anode for hole injection and a cathode for electron injection. The organic electroluminescent media supports recombination of holes and electrons that yield emissions of light. These devices are also commonly referred to as organic light-emitting diodes, or OLEDs. A basic organic EL element is described in U.S. Pat. No. 4,356,429. In order to construct a pixilated OLED display device that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. For purposes of this disclosure, a pixel is considered the smallest individual unit, which can be independently stimulated to produce light. As such, the red pixel, the green pixel, and the blue pixel are considered as three distinct pixels.

The simplest pixilated OLED displays are driven in a passive matrix configuration. In a passive matrix, the organic EL material is sandwiched between two sets of electrodes, arranged orthogonally as rows and columns. An example of a passive matrix driven OLED display is described in U.S. Pat. No. 5,276,380. This approach to producing a pixilated display, however, has several disadvantages. First, only a single row (or column) is illuminated at any given time. Therefore, in order to achieve the desired average brightness for a given frame of video, the row should be illuminated to an instantaneous brightness equal to the desired average brightness multiplied by the number of rows. This results in higher voltages and reduced long-term reliability compared to a situation where the pixels are capable of being lit continuously for the entire frame. Second, the combination of high instantaneous current and electrodes that are long and narrow, and therefore have high resistance, results in significant voltage drops across the device. These variations in voltage across the display adversely affect brightness uniformity. These two effects become worse as the size of the display and number of rows and columns are increased, thereby limiting the usefulness of passive matrix designs to relatively small, low-resolution displays.

To resolve these problems and produce higher performance devices, OLED displays driven by active matrix (AM) circuitry have been shown. In an active matrix configuration, each pixel is driven by multiple circuit elements such as transistors, capacitors, and signal lines. This circuitry permits the pixels of multiple rows to remain illuminated simultaneously, thereby decreasing the required peak brightness of each pixel. Examples of active matrix drive OLED displays are shown in U.S. Pat. Nos. 5,550,066; 6,281,634; 6,456,013; 6,501,466; 6,535,185; and 6,753,654.

In order for the light emission to exit the organic electroluminescent device, at least one of the electrodes disposed on either side of the organic electroluminescent medium, such as the anode or cathode, is made to be at least partially transparent. OLED devices are formed on a substrate, such as glass. In one configuration, known as a bottom emitting configuration, the substrate and the electrode between the organic electroluminescent media and substrate, referred to as the lower electrode, are made to be transparent or semi-transparent. In this bottom emitting configuration, the viewer views the display from the side of the substrate. The first electrode, also referred to as the lower electrode, may be constructed, for example, of a conductive film of indium tin oxide (ITO). The other electrode disposed on the opposite side of the organic electroluminescent media, which is referred to as the second electrode or upper electrode, is typically made to be reflective and highly conductive. Aluminum, Silver, and Magnesium Silver alloys are examples of materials that are useful for this upper electrode in a bottom emitter configuration.

However, active matrix type OLED displays which are made in a bottom emitting configuration have a problem that the active matrix circuitry, which is typically formed on the substrate prior to the organic electroluminescent media, is not highly transparent to light. Therefore, a portion of the pixel that contains the active matrix circuit components does not emit light. The amount of area that emits light for each pixel relative to the total area of the pixel is known as the aperture ratio (AR). Consequently, the aperture ratio of active matrix type OLED displays which are made in a bottom emitting configuration is relatively low. OLED displays having low apertures ratios must increase the electric current density per unit area through the organic electroluminescent media to achieve the same brightness level as an OLED display having a higher aperture ratio. Driving OLED displays at increase current densities is known to reduce the lifetime of the device by accelerating luminance efficiency decay over operating time. Also, increased current densities require the OLED to be driven at increased voltage levels which results in higher power consumption.

To solve these problems, active matrix type OLED displays made in a top emitting configuration have been shown. In a top emitting configuration, light emission generated by the organic electroluminescent media exits the device in the opposite direction of the substrate. Therefore, the active matrix circuitry is not in the path of the light emission and aperture ratio can be increased. Examples of top emitting active matrix OLED displays are shown in U.S. Pat. Nos. 6,737,800 and 6,392,340.

In a top emitting configuration, the upper electrode is made to be transparent or semi-transparent. For example, transparent upper electrodes can be constructed of Indium Tin Oxide (ITO) or similar transparent conductive oxide materials. Also metal films such as aluminum or silver can be used to create a semi-transparent upper electrode if the thickness of the metal is thin, such as, for example, less than 30 nm. However, these transparent and semi-transparent upper electrodes have the problem that they are not highly conductive. That is, since these films are made to be thin or of a material with low conductivity such as ITO, the sheet resistance of the upper electrode is high. High sheet resistance of the upper electrode can result in voltage drops across the upper electrode and across the display which can result in variations in the luminance output of the pixels. Also, high sheet resistance can result in increased power consumption as well as heat generation.

One approach to improving the conductivity of the upper electrode for a top emitting active matrix type OLED display as proposed in U.S. Pat. No. 6,538,374 is to dispose patterned lines of highly conductive materials, such as aluminum, in electrical contact with the upper electrode in a region between the pixels. However, this approach has the disadvantage that patterning of the lines of conductive material after forming the organic electroluminescent material is difficult to achieve. This is because conventional photolithography with solvent based resist materials often cannot be easily applied without damaging the organic electroluminescent materials. Other methods, such as formation of the lines of conductive material by deposition through a shadow mask are difficult to align, particularly if applied to large substrates.

Another approach to improving the conductivity of the upper electrode for a top emitting active matrix type OLED display is to connect the upper electrode to highly conductive current supply lines provided on the substrate prior to deposition of the organic electroluminescent materials. Such current supply lines can be formed by photolithography methods. Examples of OLED displays where the upper electrode is connected to current supply line located on the substrate are shown in U.S. Patent Application Publications 2003/0146693 A1 and 2004/0160170 A1. In this approach, a region between the pixels is provided with a connection area that is free of the organic electroluminescent materials in order for the upper electrode to make electrical connection to the current supply lines on the substrate. This can be achieved by selectively depositing the organic electroluminescent materials by, for example, use of precision aligned shadow masks. However, such precise patterning and alignment during the deposition by, for example precision aligned shadow masks, is difficult to achieve with accuracy on large substrates or for displays having high resolutions.

Alternately, the organic electroluminescent material can be initially deposited over the pixel emission region and the supply line region without precision deposition alignment and then removed in a region between the pixels by a means such as laser ablation prior to formation of the upper electrode as described in U.S. Pat. No. 6,995,035. However, the organic electroluminescent materials are not typically made to be absorbing of wavelengths commonly used for many lasers, particularly visible and infrared wavelengths. In fact, the organic electroluminescent materials are typically highly transparent at these wavelengths in order to facilitate emission of visible light. This limits the choice of lasers to those having specific ranges of wavelengths such as ultraviolet or near ultraviolet wavelengths or lasers having high power density output, thereby resulting in high manufacturing cost.

SUMMARY OF THE INVENTION

In one aspect of the present invention, a method of making an OLED device comprises providing a substrate; a first electrode, a conductive bus line over the substrate and an organic electroluminescent media over the first electrode and over the conductive bus line. A laser that operating at a predetermined wavelength and is scanned over the conductive bus line in a predetermined direction so that the conductive bus line absorbs sufficient energy to cause the ablation a portion of the organic electroluminescent media over the conductive bus line thereby forming an opening in the organic electroluminescent media. The width of the laser beam in the predetermined direction is less than four times the width of the conductive bus line; and forming a second electrode over the organic electroluminescent media, the first electrode, and through the opening in the organic electroluminescent media.

The present invention provides an effective way of forming an electrical connection between an electrode and a bus of an OLED device. The power of the laser can be at reduced levels permitting increased laser scan speeds.

BRIEF DESCRIPTION OF THE DRAWINGS

Since feature dimensions such as layer thicknesses are frequently in sub-micrometer ranges, the drawings are scaled for ease of visualization rather than dimensional accuracy.

DETAILED DESCRIPTION OF THE INVENTION

Figure 1:
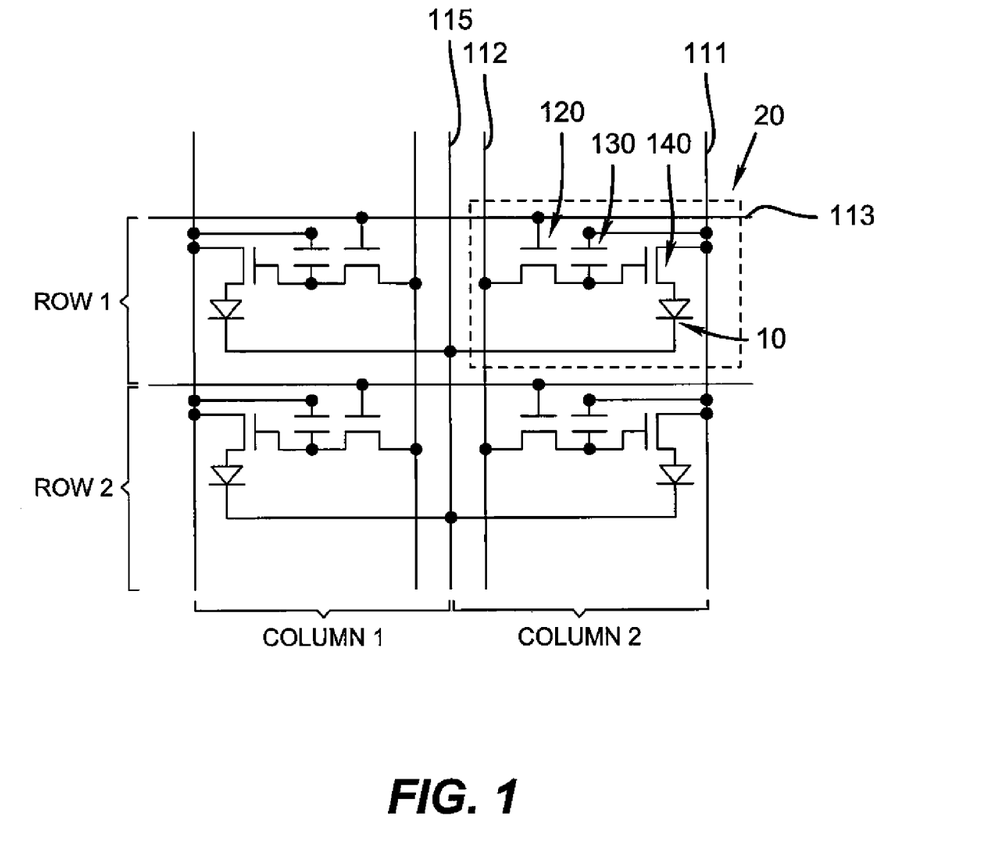
FIG. 1 depicts a circuit layout of the active matrix drive circuitry of an OLED display device according to the present invention.

FIG. 1 shows a circuit schematic diagram for the active matrix drive circuitry of an active matrix type OLED display according to the present invention. The active matrix drive circuitry is arranged to drive a plurality of pixels such as pixel 20. While, two rows and three columns of pixels are shown, this basic design can be expanded to a larger number of rows and columns by one skilled in the art. This schematic circuit can be used for driving a variety of OLED display device configurations. For example, this schematic circuit can be used to drive a four-color OLED display having, for example, red, green, blue and white pixels. OLED display devices having more or less differently colored pixels can also be applied to the present invention. The active matrix drive circuitry is composed of signal lines such as select line 113, data line 112, power line 111, and conductive bus line 115.

The active matrix drive circuitry further includes circuit components for each pixel such as select transistor 120, power transistor 140, and storage capacitor 130, which together with one of more of the signal lines are arranged to drive the organic light-emitting diode 10 of pixel 20. The other pixels are provided with similar components to drive the respective organic light-emitting diodes of these other pixels. The anode of organic light-emitting diode 10 is electrically connected to power transistor 140 as shown. The term "electrical connection" is used in this disclosure to indicate connection either directly by way of a conductor or indirectly through a component such as a switch, transistor, diode or the like. An electrical connection may have some electrical resistance. The cathode of organic light-emitting diode 10 is electrically connected to conductive bus line 115 as shown. Conductive bus line 115 provides a low resistance path for carrying the cathode current. Electrical power is supplied to the organic light-emitting diodes by way of a first voltage potential applied to the power lines and a second voltage potential applied to the bus lines. Alternately, the organic light-emitting diodes can be arranged in the opposite orientation with the cathodes connected to the power transistors and the anodes connected to the bus lines. In this example, one bus line is provided for every two columns of pixels. Alternately, bus lines are provided at other intervals such as every column, every third column, or larger intervals. Bus lines can alternately be provided in the direction of the rows instead of the direction of the columns or be provide in both a row and column direction.

The operation of this circuit will now be described. Each row of pixels is selected in turn by applying a voltage signal to the select line associated with the row, such as select line 113, which turns on the select transistor, such as select transistor 120, for each pixel. The brightness level, or gray scale information, for each pixel is controlled by a voltage signal, which has been set on the data lines, such as data line 112. The storage capacitor, such as storage capacitor 130, for each pixel is then charged to the voltage level of the data line associated with that pixel and maintains the data voltage until the row is selected again during the next image frame. The storage capacitor 130 is connected to the gate terminal of the power transistor 140. Power transistor 140 regulates the current flow through its source and drain terminals and to the organic light-emitting diode 10 in response to the voltage level held on it gate terminal by storage capacitor 130, thereby controlling the pixel's brightness. Each row is then unselected by applying a voltage signal to the select line, which turns off the select transistors. The data line signal values are then set to the levels desired for the next row and the select line of the next row is turned on. This is repeated for every row of pixels.

As such, select lines are signal lines that serve the function of isolating a row of pixels so that the gray scale information can be loaded into the pixels of the row. Data lines are signal lines that provide the gray scale information to the pixels. This gray scale information can be in the form of a voltage or current signal. Power lines are signal lines that provide a source of electrical power to the organic light-emitting diodes of the pixels for maintaining the brightness level of the pixel, at least during the time when the pixels row is not selected by the select line. Typically, the power lines provide a source of electrical power to the organic light-emitting diode at all times when the pixels are illuminated. The bus lines are electrically connected to either the cathode or the anode of the organic light emitting diode and provide a low resistance path to complete the circuit for the current provided from the power line and through the organic light emitting diode.

Many different alternate types of circuit arrangements are known in the art for driving OLED displays. These alternate types of circuit arrangements have various arrangements and numbers of circuit components and signal lines serving these basic functions. By adding bus lines and forming openings in the organic EL media using the methods described herein, the present invention can be applied to these alternate types of circuit arrangements by one skilled in the art. As such, the present invention is not limited to the specific circuit arrangement shown here. These alternate circuit arrangements include, for example, current mirror type circuits similar to those shown in U.S. Pat. Nos. 6,091,203, 6,501,466, 6,535, 185 and 6,774,877 as well as the pixel circuits shown in U.S. Pat. No. 6,229,506 and the pixel circuit described in U.S. Patent Application Publication 2004/0222746 A1.

Figure 2:
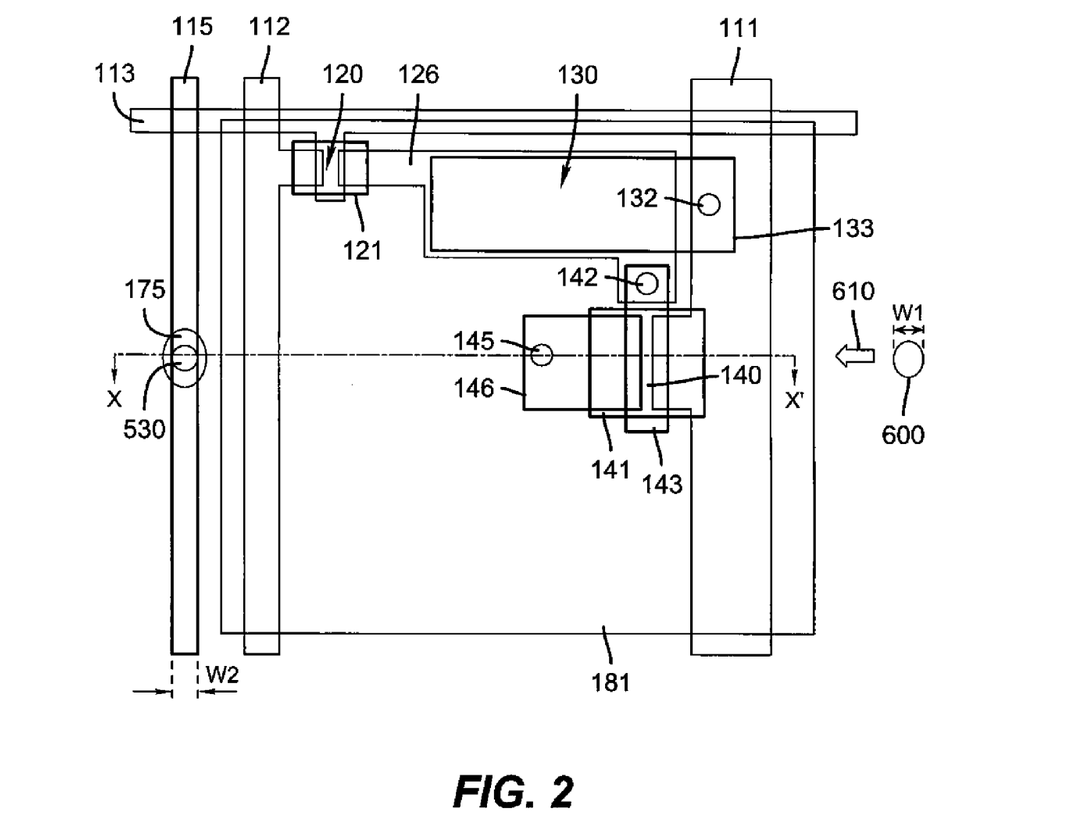
FIG. 2 depicts the construction and layout of the components of the drive circuitry used to drive a pixel of an OLED display device according the present invention.
Figure 3:
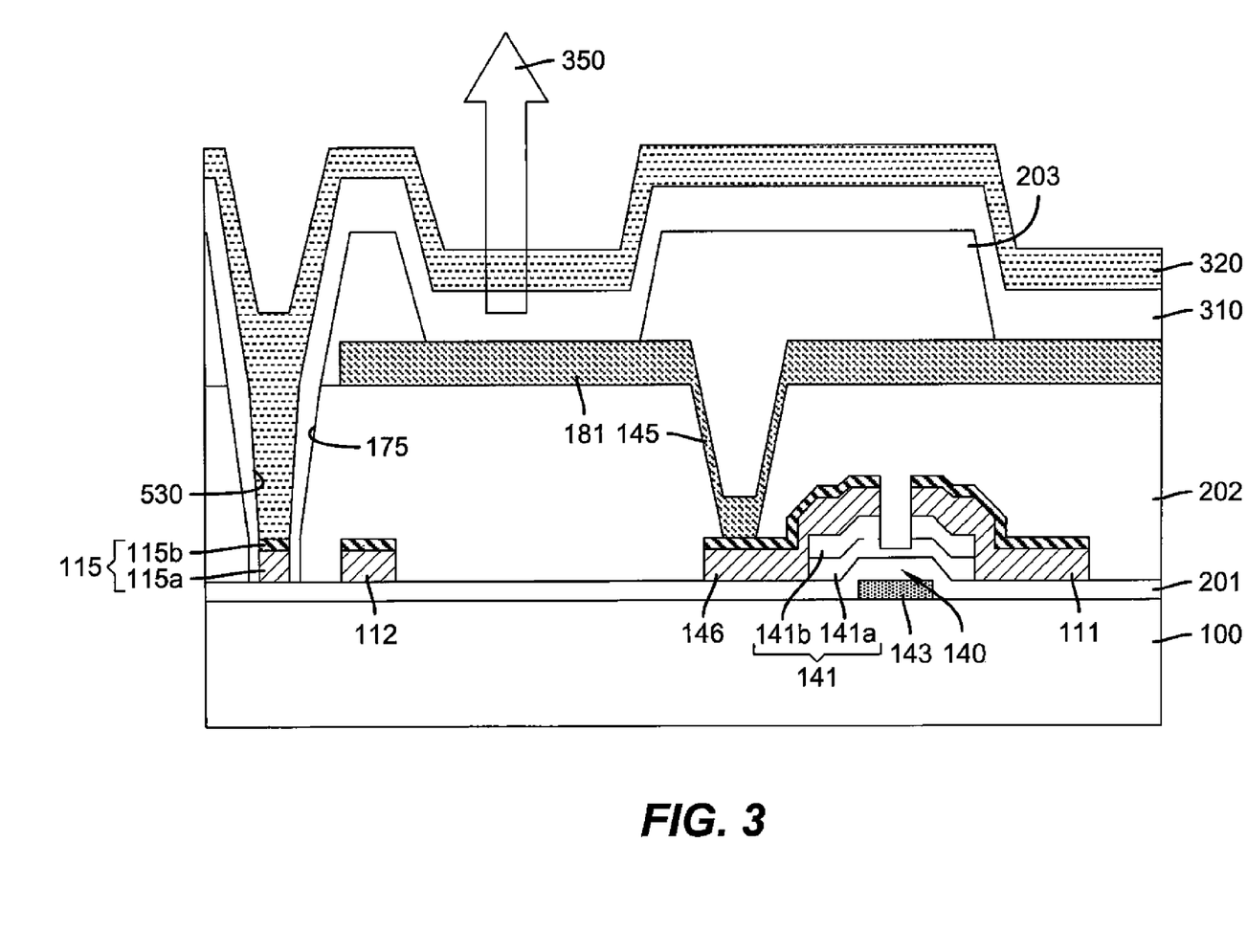
FIG. 3 depicts a cross sectional view along line X-X' of the OLED display device of FIG. 2.

An example pixel of an OLED display device according to the present invention will now be described with reference to FIG. 2 and FIG. 3. FIG. 2 shows a top side view of portions of the drive circuitry used to drive pixel 20. FIG. 3 shows a cross-sectional view of pixel 20 along line X-X'. The drive circuitry components are patterned from layers formed over substrate 100. The construction of the various circuit components such as select transistor 120, storage capacitor 130, and power transistor 140 can be seen in FIG. 2. The drive circuitry components are fabricated using conventional integrated circuit and thin film transistor fabrication technologies. Select line 113 is formed in a first conductor layer. Power line 111, conductive bus line 115 and data line 112 are formed in a second conductor layer. A first insulator layer 201 is formed between these first and second conductor layers in order to provide electrical isolation. This configuration allows the data lines and power lines to cross without electrically connecting thereby forming the matrix of pixels. Electrical connections between features formed in the different conductor layers are achieved by forming contact holes, also referred to as vias, through the insulator layers disposed between the conductor layers.

A portion of the select line 113 extends to form the gate of select transistor 120. Over this first conductor layer is first insulator layer 201, which is also referred to as the gate insulator layer. Select transistor 120 is formed from a first semiconductor region 121 using techniques well known in the art. The first terminal, which can be either the source or drain terminal, is formed from a portion of data line 112. The second terminal of select transistor 120, terminal 126, extends to form the second capacitor electrode of storage capacitor 130 and also to electrically connect to the power transistor gate electrode 143 of power transistor 140 through contact hole 142. The transistors, such as select transistor 120, are shown as bottom gate type transistors, however, other types such as top gate and dual-gate transistors are also known in the art and can be employed in the present invention. Similarly, power transistor 140 is formed in a second semiconductor region 141. The first semiconductor region 121 and second semiconductor region 141 are typically formed in the same semiconductor layer over the gate insulator layer. The semiconductor layer is composed of multiple sub-layers such as an intrinsic, or undoped, sub-layer and a doped sub-layer. This semiconductor layer here is amorphous silicon but can also be polycrystalline or crystalline or known semiconductor materials other than silicon, such as organic semiconductors and metal oxide semiconductors. The power transistor gate electrode 143 of power transistor 140 is formed in the first conductor layer. The first terminal of power transistor 140 is formed from a portion of power line 111, as shown. The second terminal 146 of power transistor 140 is formed in the second conductor layer. Storage capacitor 130 is formed between a first capacitor electrode 133 formed in the first conductor layer and the second capacitor electrode formed as a portion of terminal 126 as described above. The first insulator layer 201 is similarly disposed between the first capacitor electrode and the second capacitor electrode. The first capacitor electrode 133 is electrically connected to power line 111 through contact hole 132. The present invention can also be made to work with other alternate configurations known in the art where the storage capacitor is not directly connected to the power line but is instead provided a separate capacitor line, which may be maintained at a different voltage level or the same voltage level relative to the power line. Other alternatives where the innate capacitance between of the power transistor and the power line is used as the storage capacitor instead of a separate capacitor are also known in the art and can be employed in the present invention.

First electrode 181 of the organic light emitting diode is formed from a third conductor layer formed over the first and second conductor layers. A second insulator layer 202 is located between the first electrode 181 and the second conductor layer. The first electrode 181 of the organic light emitting diode is connected to power transistor 140 through contact hole 145 formed in this second insulator layer.

First electrode 181 serves to provide electrical contact to the organic electroluminescent media 310 of the organic light emitting diodes. Over the perimeter edges first electrode 181, an inter-pixel insulator layer 203 may also be formed to cover the edges of the electrodes and reduce shorting defects as is known in the art. Examples of such inter-pixel insulator layers can be found in U.S. Pat. No. 6,246,179.

Conductive bus line 115 is arranged to connect to the second electrode 320 of the organic light emitting diodes. As such, contact hole 175 is provided as an opening in the second insulator layer. According to the present invention, an opening 530 is also formed in the organic electroluminescent media to provide for this electrical connection between the second electrode and the conductive bus line 115. These insulator layers are shown as single layers but may actually comprise several sub-layers of different insulating materials. The construction of the amorphous silicon power transistor 140 is shown in FIG. 3. The second semiconductor region 141 is shown with an intrinsic sub-layer 141a and doped sub-layer 141b.

Over first electrode 181, the organic electroluminescent media 310 is formed. For simplicity of illustration, the organic electroluminescent media 310 is shown as a single layer in FIG. 3, but it is preferably composed of a plurality of sub-layers such as a hole injecting sub-layer, hole transporting sub-layer, one or more emitting sub-layers, electron transporting sub-layer, and electron injecting sub-layers. Various constructions and combinations of such layers are known in the art. Above the organic electroluminescent media 310, the second electrode 320 is formed. The first electrode 181 and second electrode 320 serve as spaced apart electrodes which provide electrical current to the organic electroluminescent media 310 disposed between said electrodes. There are numerous configurations of the organic electroluminescent media 310 wherein the present invention can be successfully practiced. Preferably, a broadband or white light emitting configuration that emits light at the wavelengths used by all the pixels is used to avoid the need for patterning the organic electroluminescent media between pixels. In this case, color filters elements (not shown) are provided in the path of the light (light 350) to produce the desired light colors from the white or broadband emission for a multi-color display.

When electrically stimulated, the organic electroluminescent media 310 above the first electrode 181 in the area defined by the opening of the inter-pixel insulator 203 will emit light 350. In FIG. 3, light 350 is shown as exiting the top of the device (the direction opposite insulating substrate 100). This configuration is known as a top-emitting configuration. This requires that second electrode 320 be at least partially transparent. As such, second electrode 320 can be constructed of materials such as indium tin oxide (ITO), indium zinc oxide (IZO), or thin (less than 30 nm) layers of metal such as aluminum or silver. The first electrode is typically reflective in such a configuration, being constructed at least in part of a reflective metals such as aluminum, aluminum alloys, silver, silver alloys, or molybdenum.

In order to form opening 530 in the organic electroluminescent media 310, laser beam 600 is provided. Laser beam 600 is focused into a single spot, an array of spots from an array of discreet laser elements, or a linear array of spots emanating from a bar-shaped beam that is split into a multiplicity of independent spots by a light modulator of individually addressed gate elements, with the spot or array of spots. The focused spot of laser beam 600 has a width W1 in the scan direction W1. Laser beam 600 is scanned in scan direction 610, which is preferably perpendicular to conductive bus line 115. The focused spot of laser beam 600 also has a length in the opposite direction, which can be greater than or less than its width. That is, the focused spot of laser beam 600 can be a square shape, a round shape, a ellipse shape, or some other shape. Conductive bus line 115 absorbs the laser's photon energy resulting in the generation of heat. This heat energy is transferred in to the organic electroluminescent media 310 causing localized ablation of the organic materials thereby forming opening 530. In order to improve the containment of heat in conductive bus line 115, it has been discovered by the present inventors that the width W2 of conductive bus line should be made small relative to the scan direction width W1 of laser beam 600. That is, width W2 is preferably made to be less than four times larger than width W1. For even better heat containment and localized ablation, width W2 is preferably be made to be less than two times larger than width W1. And for the most preferred heat containment and localized ablation, width W2 is preferably be made to be equal to or less than width W1. Improved heat containment has an advantage in that reduced laser energy is needed to cause ablation. This allows the use of less powerful, and therefore less expensive, laser devices. Reduced laser energy can also have the advantage of enabling the laser to be scanned at increased speeds, thereby reducing manufacturing time.

In an alternate embodiment of the present invention, further reductions in laser energy and increases in writing speeds can be obtained by use of a multiplicity of adjacent lasers or laser spots whereby the adjacent spots are parallel to the conductive bus lines and perpendicular to the scan direction, and are activated simultaneously as they intercept the conductive bus lines. When two or more adjacent lasers or laser channels are simultaneously activated, holes are formed through the electroluminescent material at dramatically lower laser energies and faster writing speeds due to a thermal diffusion effect that creates higher temperatures on the substrate than with a single beam or spot, particularly in the middle of the spot array.

A wide variety of laser types and wavelengths can be used within the scope of this invention so long as at least a portion of the laser light is absorbed by the conductive bus line 115. Particularly useful types of lasers include red and infra-red type lasers having wavelengths of between 700 and 1100 nm and more preferably between 800 and 850 nm. Preferred sources of laser radiation include diode lasers and Nd-YAG lasers. In one particularly preferred embodiment, the radiation is generated by diode lasers having a peak emission between 800 and 850 nm. Such lasers, which emit light in this wavelength range, can successfully cause ablation of the organic electroluminescent media over the conductive bus line while limiting damage to other features such as the metal of the conductive bus line 115. Such lasers can be focused into a beam or an array of individually activated beams or channels, having a spot size W1 at the focal plane of approximately 2-5 micrometers in the scan direction. The shape of the energy distribution in the scan direction is typically gaussian in nature. When a bar laser with a linear-array light modulator is employed, the size of the spot at the focal plane in the array direction is determined by the light modulator window, and is typically 5 micrometers. In this case, the width W2 of conductive bus line 115 is preferably less than 20 micrometers, more preferably less than 10 micrometers, and even more preferably less than 5 micrometers. Laser beam 600 preferably exposes the device from the top side, that is where the organic electroluminescent media 310 is between the laser source and the substrate 100.

Bus line 115 may have a uniform width W2 along its entire length as shown. Alternately, the bus line 115 may be wider than W2 is some areas and narrowed to W2 in the area intended for ablation of opening 530. The width W1 of laser beam 600 is defined as the width in the scan direction (direction 610). The laser beam does not have to be continuously on during the entire scan duration. For example, the laser beam may be pulsed when scanning such that it turns on just prior to intercepting bus line 115 and then turned off again after it has moved past bus line 115. This requires that the laser timing be precisely aligned to the position of the bus line 115. In this case, there is reduced risk of undesired ablation of the organic electroluminescent media in areas above first electrode 181.

Alternately, in a preferred embodiment of the present invention, bus line 115 is made to be more absorbing of the laser energy than the first electrode 181. This arrangement allows the laser beam 600 to be on while over part or all of first electrode 181. This reduces the requirement of alignment of the laser beam 600 to conductive bus line 115. In order to enable this preferred embodiment, it is preferred that conductive bus line 115 be made to be more absorptive at the wavelength of laser beam 600 than the first electrode 181. That is, the materials of conductive bus line 115 are selected to be more absorbing at the wavelength of laser beam 600 than the materials of first electrode 181. First electrode 181 is preferably reflective to both the light 350, which is visible light, and to the light of laser beam 600, which is preferably longer red or infrared. Useful material for first electrode 181 therefore include Al, Ag, or alloys containing Al or Ag such as Al:Nd alloys and the like. First electrode 181 may also have a transparent overcoat such as has been shown in the art, for example an overcoat of ITO or the like. In order to make bus line more absorptive to the wavelength of laser beam 600, it preferably comprise a conductive material which is more absorptive at the wavelength of the laser beam than first electrode 181. Preferable conductive materials which have sufficient absorption in the red and infrared wavelengths include Ti, Cr, Mo, W, Ni, Zr, or mixtures and alloys thereof. Conductive bus line also must be highly conductive. Therefore, a particularly useful configuration of bus line 115 according to the present invention is to construct bus line 115 with an absorptive sub-layer 115b and a highly conductive sub-layer 115a as shown in FIG. 3. The conductive sub-layer 115a preferably contains highly conductive materials such as Al and Al alloys. The absorptive sub-layer 115b is preferably comprised of Ti, Cr, Mo, W, Ni, Zr, or mixtures and alloys thereof. Ti, Cr, Mo, and W are also particularly preferred to provide a stable, conductive barrier material between the second electrode 320, which can be ITO and an aluminum containing conductive sub-layer 115a. In order to provide good conduction, conductive sub-layer 115a is preferably 100 to 400 nm in thickness. In order to provide good absorption, absorptive sub-layer 115b is preferably 25 to 100 nm in thickness.

EXAMPLE

A demonstration of an opening, such as opening 530, through an electroluminescent material 310 over a conductive buss line 115 by means of laser ablation was provided by first vacuum coating a 2.5 inch square glass substrate in with a highly conductive sub-layer of 400 nm evaporated Aluminum followed a absorptive sub-layer 50 nm sputtered Molybdenum. The metal coated substrate was then spin coated with Shipley 1805 resist, and a line pattern was formed by means of a conventional lithographic methods by selective UV exposure of the resist and developing the image with MF-319 developer. The resist-patterned substrate was then etched in a liquid etch solution containing phosphoric, acetic, and nitric acids, rinsed and cleaned. According to the pattern, resulting metal bus lines were formed with a repeating sequence of nominally 5, 15, 30, and 75 micrometer widths each spaced 100 micrometers apart. The actual line widths varied in the range of 3-6, 13-16, 30-34, and 70-75 micrometers respectively due to process and etch variability. Over the metal bus lines, a vacuum deposition a 400 nm layer of electroluminescent material comprising tris(8-hydroxyquinoline) aluminum (ALQ) was deposited. ALQ is a material well known in the art and commonly used for the formation of OLED devices. For purposes of this experiment, no thin film transistors, signal lines were formed other than the conductive bus line, or insulator layers were formed.

The substrate was then exposed using a laser system to form contact holes (or openings) in the organic electroluminescent material over the bus lines. The laser system consisted of a non-coherent infrared diode laser bar having a wavelength of 808 nm (+/−10 nm) whose beam was divided into 256 separate addressable channels modulated by a spatial light modulator. Each channel had a length of 5 micrometers in a direction parallel to the bus lines. In the sample that follows below, spots comprising groups of 1, 2, 3, and 5 adjacent channels were activated simultaneously in order to demonstrate the thermal adjacency effect of multiple channel patterns. It will be understood that any combination of multiple channel patterns are possible including alternating on and off channels at the outer edge of the channel group in order to provide a gradient of heat increasing towards the middle of the group. An example of such a special pattern is shown in table 2. Such a pattern will concentrate the resulting hole over a smaller area of the conductive line. The beam intensity distribution in the laser scan direction 610 (direction perpendicular to the metal bus lines) was guassian whose $1/e^2$ diameter value is 3.6 micrometers. That is, for example, a pattern comprising 5 channels on would have a length of 15 micrometers and a width (in scan direction 610) of 3.6 micrometers. For the purpose of this example, the laser beam was activated continuously during all the hole formation scans perpendicular to the direction of the metal conductive buss lines. The beam was scanned across the sample by a two axis movable stage that held the sample by means of a vacuum. Exposure occurred as the movable stage scanned at speeds between 1.0 and 0.01 meter per second in scan direction 610. It was preferred that ablation take place under powers available that were between 38 and 55 milliwatts per channel corresponding to a total exposure range of between 1.08 and 55 $J/cm^2$.

A series of contact holes where then formed by scanning a 3 channel long (15 micrometer) by 3.6 micrometer wide laser beam 600 spot having a single, constant exposure energy of 2.2 $mJ/cm^2$ and a scan speed of 0.5 m/s. The results are shown below in Table 1.

TABLE 1

Beam Conditions: 3 Channel Beam 15 micrometers long by 3.6 micrometers wide in Scan Direction
Exposure: 2.2 $J/cm^2$ at Scan Speed of 0.5 m/s

| Metal Bus Line Width | Contact Hole Length Over Lines |
| --- | --- |
| 71 micrometers | None |
| 34 micrometers | None |
| 13 micrometers | None |
| 5.8 micrometers | Incomplete and Partial Opening |
| 4.3 micrometers | 9.9 um Length Along Line |
| 3.3 micrometers | 27 um Length Along Line |

As can be seen from table 1, contact hole formation was favored on the smaller lines. That is, for this exposure intensity, no contact holes were formed until the metal bus lines were less than 5.8 micrometers (or less than 2 times the 3.6 micrometer width of the laser beam spot in the scan direction). Most preferably, the largest (longest) contact holes were formed on metal bus lines that were about the same size (3.3 micrometers) as the beam in the scan direction.

A series of contact holes where also formed by varying the exposure intensity of the laser beam 600 spot. Also, various laser beam spot lengths were investigated by turning on different numbers of adjacent channels. The results are shown below in Table 2, which lists the lowest energy exposures required to form holes over the 13 to 15 and 4 to 5 micrometer wide bus lines for the different channel patterns. The 4-5 micrometer wide bus lines represent lines that are 1.1 to 1.4 times (approximately 1 times) as wide as the laser spot width (3.6 micrometers). The 13 to 15 micrometer wide bus lines represent lines that are 3.6 to 4.2 times (approximately 4 times) as wide as the laser spot width (3.6 micrometers). A special group of 7 channels whereby channels 2 and 6 were deactivated demonstrated the same hole formation exposure as 5 adjacent channels but with a smaller hole and less damage to electroluminescent areas adjacent to the lines.

TABLE 2

| Number of Adjacent Channels Activated in Beam | Metal Line Width Range 13-15 micrometers | Metal Line Width Range 4-5 micrometers |
|---|---|---|
| 1 Channel on | No Holes up to 55 J/cm$^2$ | 55 J/cm$^2$ |
| 2 Channels on | 37 J/cm$^2$ | 11 J/cm$^2$ |
| 3 Channels on | 11 J/cm$^2$ | 2.2 J/cm$^2$ |
| 5 Channels on | 2.8 J/cm$^2$ | 1.6 J/cm$^2$ |
| 7 Channels (1011101* Pattern) | 2.8 J/cm$^2$ | 1.6 J/cm$^2$ |

*1 = Channel On, 0 = Channel Off

As can be seen from Table 2 that ablation could be induced on both the 13 to 15 micrometer bus lines at approximately 4 times the width of the laser beam spot and on the 4 to 5 micrometer bus lines at approximate 1 times the width of the laser beam spot. The lesser width of the 4 to 5 micrometer bus lines resulted in less required laser energy to form a contact hole. In all cases, the required laser energy increased for the wider 13 to 15 micrometer bus lines. It can also be seen that using a longer laser spot by turning on multiple adjacent channels reduced the required laser energy needed to form a contact hole.

In all cases where holes were formed, the ablation was contained to a region directly over the conductive aluminum-molybdenum bus lines, with little damage or disruption to the electroluminescent material in areas away from of the metal bus lines, even though the lasers were activated over these areas. That is, the opening 530 was observed to have about the same width in the scan direction 610 as the width of the conductive bus line 115. What damage or disruption did occur to the electroluminescent material outside of the lines was confined to a distance of no more than the width of the metal line itself.

By selecting high enough laser energy density, contact holes could be formed for a range of bus line widths. However, as can be seen from tables 1 and 2, in order to keep the laser energy low, such as to enable low cost manufacturing and not damage the metal conductive bus lines, conductive bus lines of less than four times the laser beam spot width, and preferably less than two times the laser beam spot width are employed. In order to enable the lowest energy density in the most preferred embodiments, conductive bus lines having a width of equal to or less than laser beam spot width are employed.

The invention has been described in detail with particular reference to certain preferred embodiments thereof, but it will be understood that variations and modifications can be effected within the spirit and scope of the invention.

| PARTS LIST | |
|---|---|
| 10 | light-emitting diode |
| 20 | pixel |
| 100 | substrate |
| 111 | power line |
| 112 | data line |
| 113 | select line |
| 115 | conductive bus line |
| 115a | highly conductive sub-layer |
| 115b | absorptive sub-layer |
| 120 | select transistor |
| 121 | first semiconductor region |
| 126 | terminal |
| 130 | storage capacitor |
| 132 | contact hole |
| 133 | first capacitor electrode |
| 140 | power transistor |
| 141 | second semiconductor region |
| 141a | intrinsic sub-layer |
| 141b | doped sublayer |
| 142 | contact hole |
| 143 | power transistor gate electrode |
| 145 | contact hole |
| 146 | second terminal |
| 175 | contact hole |
| 181 | first electrode |
| 201 | first insulator layer |
| 202 | second insulator layer |
| 203 | inter-pixel insulator layer |
| 310 | organic electroluminescent media |
| 320 | second electrode |
| 350 | light |
| 530 | opening |
| 600 | laser beam |
| 610 | scan direction |

The invention claimed is:

1. A method of making an OLED device, comprising:
   a) providing a substrate and a first electrode and a conductive bus line over the substrate;
   b) providing organic electroluminescent media over the first electrode and over the conductive bus line; and
   c) scanning a laser that operates at a predetermined wavelength over the conductive bus line in a predetermined direction so that the conductive bus line absorbs sufficient energy to cause the ablation a portion of the organic electroluminescent media over the conductive bus line thereby forming an opening in the organic electroluminescent media, the width of the conductive bus line in the predetermined direction being determined less than four times the width of the laser beam; and forming a second electrode over the organic electroluminescent media, the first electrode, and through the opening in the organic electroluminescent media so as to provide electrical connection between the second electrode and the conductive bus line.

2. The method of claim 1 wherein the width of the conductive bus line is less than two times the width of the laser beam.

3. The method of claim 1, wherein the width of the conductive bus line is equal to or less than the width of the laser beam.

4. The method of claim 1, wherein the conductive bus line is more absorptive at the wavelength of the laser beam than the first electrode.

5. The method of claim 1, wherein the laser beam is scanned continuously over both the first electrode and the conductive bus line.

6. The method of claim 1, wherein the predetermined direction of the laser scan is perpendicular to the conductive bus line.

7. The method of claim 1, wherein the conductive bus line comprises Ti, Cr, Mo, W, Ni, Zr, or mixtures and alloys thereof.

8. The method of claim 1 wherein the conductive bus line has a sub-layer comprising Ti, Cr, Mo, W, Ni, Zr, or mixtures and alloys thereof.

9. The method of claim 1, wherein the first electrode comprises Al, Ag, or alloys containing Al or Ag.

10. The method of claim 1, wherein the predetermined wavelength of the laser is between 700 and 1100 nm.

11. A method of making an opening through a media to a conductive line, comprising:
   a) providing a substrate, a conductive line over the substrate and the media over the conductive line;
   d) providing a laser that operates at a predetermined wavelength; and
   e) scanning the laser beam over the conductive line in a predetermined direction so that the conductive bus line absorbs sufficient energy to cause the ablation a portion of the media over the conductive line thereby forming an opening in the media, the width of the conductive bus line in the predetermined direction being less than four times the width of the laser beam.

12. The method of claim 11, wherein the predetermined direction of the laser scan is perpendicular to the conductive line.

13. The method of claim 11, wherein the width of the laser beam being less than two times the width of the conductive line.

14. The method of claim 11, wherein the width of the laser beam being less is equal to or less than the width of the conductive line.

15. The method of claim 11, wherein the media includes organic material.

* * * * *